United States Patent
Whang et al.

(10) Patent No.: US 9,275,904 B2
(45) Date of Patent: Mar. 1, 2016

(54) METHOD FOR FABRICATING SEMICONDUCTOR DEVICE

(75) Inventors: Sung-Jin Whang, Gyeonggi-do (KR);
Moon-Sig Joo, Gyeonggi-do (KR);
Yong-Seok Eun, Gyeonggi-do (KR);
Kwon Hong, Gyeonggi-do (KR);
Bo-Min Seo, Gyeonggi-do (KR);
Kyoung-Eun Chang, Gyeonggi-do (KR); Seung-Woo Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 716 days.

(21) Appl. No.: 12/614,991

(22) Filed: Nov. 9, 2009

(65) Prior Publication Data
US 2011/0045666 A1 Feb. 24, 2011

(30) Foreign Application Priority Data

Aug. 19, 2009 (KR) ........................ 10-2009-0076721

(51) Int. Cl.
H01L 21/8234 (2006.01)
H01L 21/28 (2006.01)
H01L 27/108 (2006.01)
H01L 27/115 (2006.01)
H01L 29/423 (2006.01)
H01L 29/49 (2006.01)

(52) U.S. Cl.
CPC .. *H01L 21/823443* (2013.01); *H01L 21/28052* (2013.01); *H01L 21/28114* (2013.01); *H01L 27/10873* (2013.01); *H01L 27/11521* (2013.01); *H01L 27/11568* (2013.01); *H01L 29/42376* (2013.01); *H01L 29/4933* (2013.01)

(58) Field of Classification Search
CPC .............. H01L 21/28052; H01L 29/4933; H01L 21/28518
USPC ............... 438/651, 655, 664, 682, 683
See application file for complete search history.

(56) References Cited

U.S. PATENT DOCUMENTS

| | | | | |
|---|---|---|---|---|
| 5,818,092 A | * | 10/1998 | Bai et al. | 257/388 |
| 6,410,429 B1 | * | 6/2002 | Ho et al. | 438/655 |
| 6,630,394 B2 | * | 10/2003 | Lu et al. | 438/592 |
| 6,630,721 B1 | * | 10/2003 | Ligon | 257/413 |
| 2008/0305630 A1 | * | 12/2008 | Fukuhara | 438/664 |

FOREIGN PATENT DOCUMENTS

| KR | 1020090083715 | 8/2009 |
|---|---|---|
| KR | 1020100067779 | 6/2010 |

OTHER PUBLICATIONS

English Machine Translation of KR 1020090083715.*
Notice of Preliminary Rejection issued from Korean Intellectual Property Office on Apr. 27, 2011.
Notice of Allowance issued from Korean Intellectual Property Office on Nov. 9, 2011.

* cited by examiner

*Primary Examiner* — Laura Menz
*Assistant Examiner* — Candice Y Chan
(74) *Attorney, Agent, or Firm* — IP & T Group LLP

(57) ABSTRACT

A method for fabricating a semiconductor device, including forming gate patterns over a substrate, forming conductive layer covering top and sidewalls of each gate pattern, forming a metal layer for a silicidation process over the conductive layer, and silicifying the conductive layer and the gate patterns using the metal layer.

12 Claims, 16 Drawing Sheets

METHOD FOR FABRICATING SEMICONDUCTOR DEVICE

CROSS-REFERENCE TO RELATED APPLICATIONS

The present application claims priority of Korean Patent Application No. 10-2009-0076721, filed on Aug. 19, 2009, which is incorporated herein by reference in its entirety.

BACKGROUND OF THE INVENTION

The present disclosure relates to a method for fabricating a semiconductor device, and more particularly, to a method for fabricating a semiconductor device including a silicide layer.

Improvement in the integration degree of a semiconductor device has reduced an area occupied by the semiconductor device while increasing resistances of gate patterns and word lines, which leads to deteriorated characteristics of the semiconductor device. Particularly, a non-volatile memory device performing a program/erase operation on a page basis has a program of decreased program/erase operation rate due to an increase in the resistance of word lines because the distance between each memory cell and a decoder is different. Therefore, conventional technologies seek to decrease the resistance by forming gate patterns and word lines by using a metal silicide layer having a low resistance value.

Hereafter, a conventional method for fabricating a gate pattern and drawbacks of the conventional method will be described with reference to the accompanying drawings.

FIGS. 1A to 1D are cross-sectional views describing a conventional method for forming gate patterns. Referring to FIG. 1A, gate patterns 11 are formed over a substrate 10. The gate patterns 11 may be gate patterns of a Dynamic Random Access Memory (DRAM) device or gate patterns of a non-volatile memory device. In the case of a gate pattern of a DRAM device, the gate pattern includes a gate insulation layer and a gate electrode. In the case of a gate pattern of a non-volatile memory device, the gate pattern includes a tunnel insulation layer, a charge trapping layer, a charge blocking layer, and a gate electrode. Herein, only a gate electrode is illustrated for the sake of convenience in description.

Subsequently, an interlayer dielectric layer 12 is formed over the substrate with the gate patterns 11 formed therein and a planarization process is performed until the uppermost surface of each gate pattern 11 is exposed.

Referring to FIG. 1B, the interlayer dielectric layer 12 is etched back to expose the upper portion of each gate pattern 11. Herein, the etched interlayer dielectric layer is denoted with a reference numeral 12A.

Referring to FIG. 1C, a metal layer 13 is formed over the substrate with the gate patterns 11 having an exposed upper portion.

Referring to FIG. 1D, the upper portion of each gate pattern 11 is silicified by having the metal layer 13 react with the upper portions of the gate patterns 11 through a thermal treatment. Herein, the gate patterns having a silicified upper portion are denoted with a reference numeral 11A. Subsequently, unreacted metal layer 13 is removed during the thermal treatment.

According to the conventional technology described above, the upper portion of each gate pattern 11, which is a gate electrode, may be metal-silicified. However, the width W of the gate electrode decreases due to a procedural limitation, while the gate patterns 11 are formed and silicified. The decreased width W of the gate electrode increases not only the resistance of the gate electrode, but also the surface resistance of word lines as well, thereby deteriorating the read/write rate of a DRAM device or the program/erase rate of a non-volatile memory device.

Hereafter, problems of conventional technology for forming gate patterns will be described specifically with reference to FIGS. 2A to 2C.

FIG. 2A illustrates a cross section of an intermediate resultant substrate with gate patterns 21 having the upper portion exposed by performing an etch-back of an interlayer dielectric layer 22. FIG. 2A corresponds to FIG. 1B described before.

As illustrated, during the etch-back process of the interlayer dielectric layer 22, the margins of a gate pattern 21 (see region labeled B in FIG. 2A) is damaged. In other words, silicon (Si) of the gate electrode is lost. In this case, the gate electrode lacks an adequate silicon source and a silicidation reaction is not performed sufficiently during a subsequent silicidation process.

In particular, the width of the upper portion of the gate electrode is decreased due to the damage of the gate pattern 21. Accordingly, the upper portion of the gate pattern 21 comes to have a conical shape (see region labeled A in FIG. 2A), thus increasing the resistance of the gate electrode.

Also, the surface of the gate pattern 21 may be damaged by a plasma gas during the etch-back process of the interlayer dielectric layer 22, and an impurity layer (see reference indicator C in FIG. 2A) may be formed on the surface due to impurities.

FIG. 2B illustrates a cross section of an intermediate resultant substrate with a metal layer 23. The drawing corresponds to FIG. 1C. As illustrated in the drawing, when the metal layer 23 is formed over the gate pattern 21 with its upper portion whose width is decreased, the metal layer 23 is not uniformly deposited over the upper portion of the gate pattern 21. Rather, it is deposited disproportionally on one side, which is a problem.

FIG. 2C illustrates a cross section of the upper portion 24 of a gate pattern 21A. The drawing corresponds to FIG. 1D. As described above, since the width of the upper portion 24 of the gate pattern 21A is decreased by the damage during the etch-back process, the gate electrode lacks an adequate silicon source to be used during a silicidation process. Accordingly, the width W1 of the upper portion 24 of the gate pattern 21A is decreased even more, thereby increasing the resistance of the gate electrode. As a result, the surface resistance of word lines increases, and the read/write operation rate of a DRAM device or a program/erase operation rate of a non-volatile memory device is decreased.

When an impurity layer (see reference indicator C) is formed over the surface of the upper portion of the gate pattern 21 during the etch-back process of the interlayer dielectric layer 22, impurities permeate during the silicidation process and inhibit the silicidation of the gate pattern 21.

Also, when the uppermost portion of the gate pattern 21 has a conical shape, the metal layer 23 is disproportionally deposited on one side of the upper portion of the gate pattern 21. Thus, there is a problem in that the gate pattern 21 inclines (see reference indicator D) or is broken (see reference indicator E).

In addition, to form a metal silicide layer having a small resistance value, the silicon of the gate pattern may be amorphous or of a small grain size. However, a thermal treatment crystallizes the silicon or increases the size of the grains. Therefore, even though a metal silicide layer is formed, the quality of the metal silicide layer is poor, and thus, the surface resistance increases.

The aforementioned problems become worse as the integration degree of a semiconductor device increases. At a high integration degree, the width of the gate pattern 21 is decreased, and thus, relatively more silicon is lost during the etch-back process. Thus, the silicidation process is not performed smoothly due to lack of the silicon source. Moreover, since the width of the upper portions 24 of the silicified gate patterns 21A are decreased, the chances that the upper portions 24 of the silicified gate patterns 21A become inclined or broken are high. In sum, as the integration degree increases, the imbalance in line width of the silicified gate patterns 21A becomes severe due to procedural limitations, and this leads to a problem of increased resistance values.

FIG. 2D shows a picture of the gate patterns inclining according to conventional technology. As illustrated in the drawing, the lack of silicon source and the unbalanced deposition of the metal layer 23 decreases the width of the gate patterns and makes the gate pattern incline.

SUMMARY OF THE INVENTION

An embodiment of the present disclosure is directed to providing a method for fabricating a semiconductor device that can provide a sufficient amount of a silicon source during a silicidation process of a gate pattern.

In accordance with an embodiment, there is provided a method for fabricating a semiconductor device, which includes: forming gate patterns over a substrate; forming conductive layer covering top and sidewalls of each gate pattern; forming a metal layer for a silicidation process over the conductive layer; and silicifying the conductive layer and the gate patterns using the metal layer.

In accordance with another embodiment, there is provided a method for fabricating a semiconductor device, which includes: forming a first conductive layer and a first hard mask layer over a substrate; forming a plurality of gate patterns by etching the first hard mask layer and the first conductive layer; filling gap regions between the plurality of gate patterns with an insulation layer; forming trenches by removing the first hard mask layer; etching the insulation layer on internal sidewalls of the trenches by a predetermined thickness in order to increase a width of the trenches; and filling the trenches having increased width with a second conductive layer.

DESCRIPTION OF SPECIFIC EMBODIMENTS

Figure 1A:
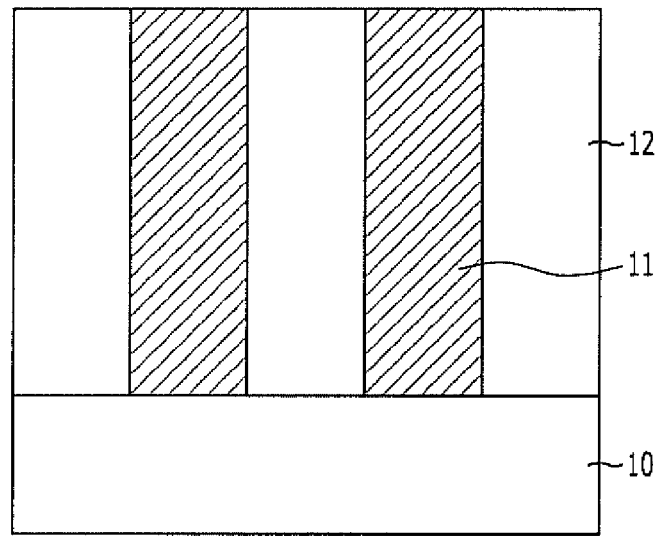
FIGS. 1A to 1D are cross-sectional views describing a conventional method for fabricating gate patterns of a semiconductor device.
Figure 1B:
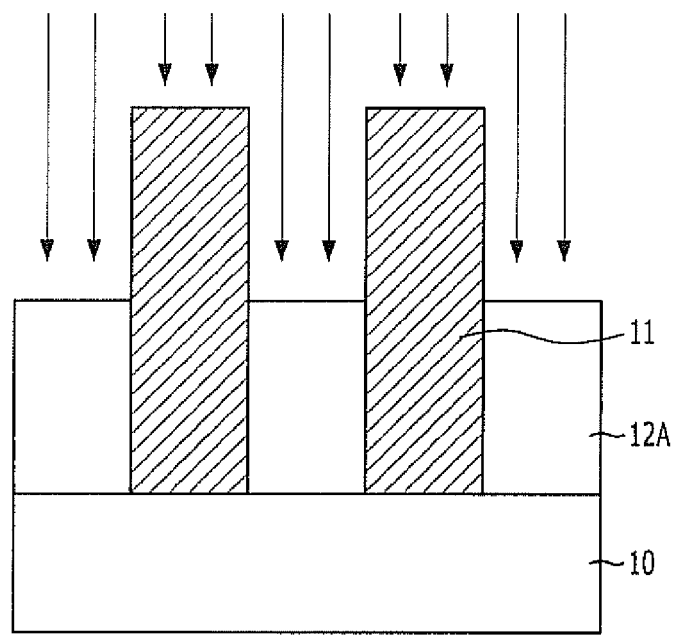
Figure 1C:
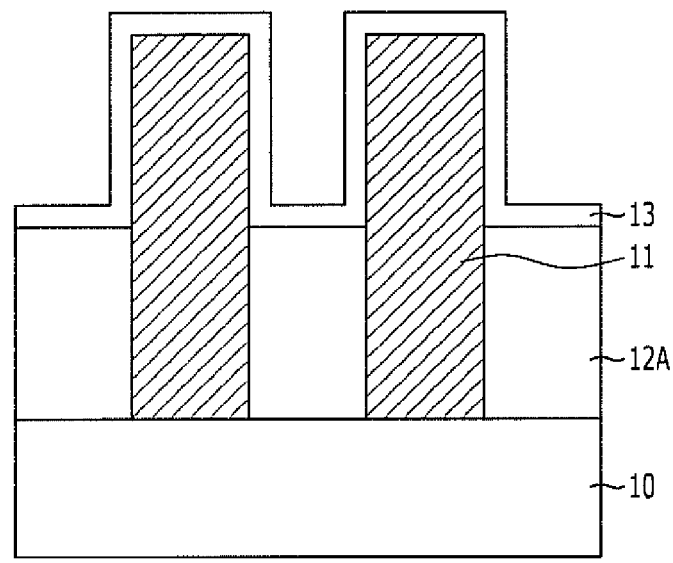
Figure 1D:
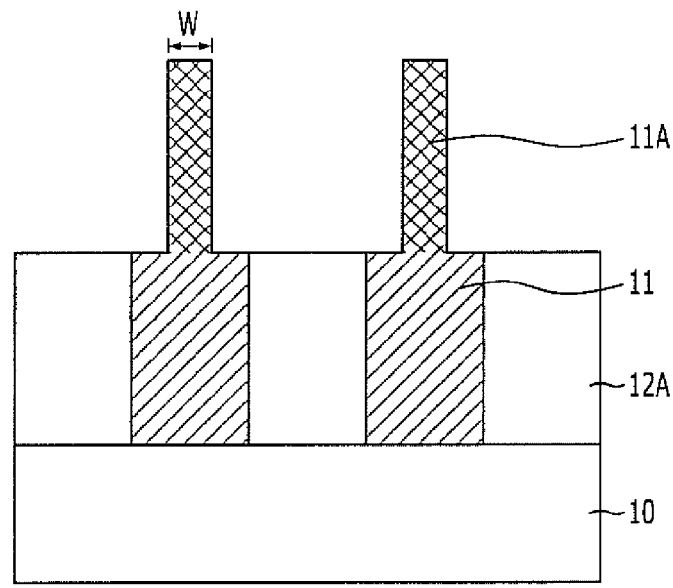
Figure 2A:
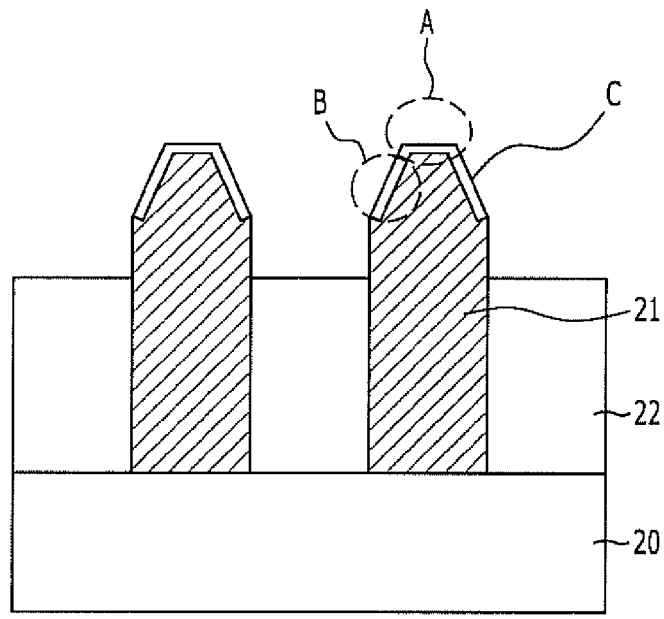
FIGS. 2A to 2C illustrate problems of a conventional semiconductor device fabrication process.
Figure 2B:
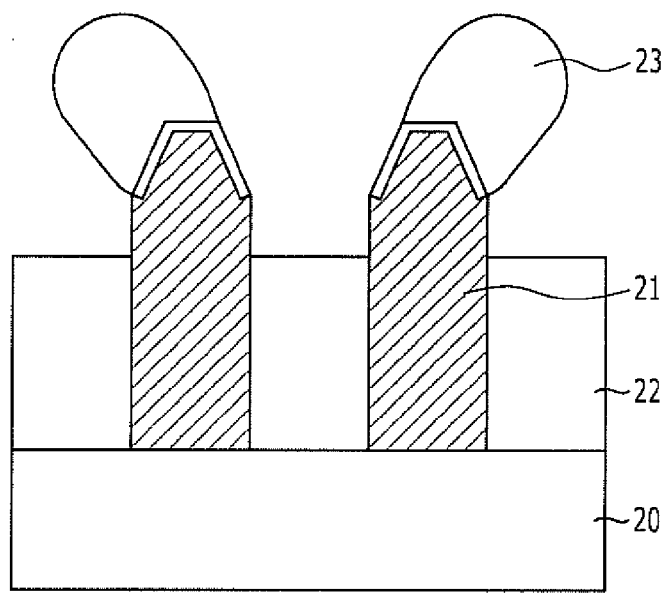
Figure 2C:
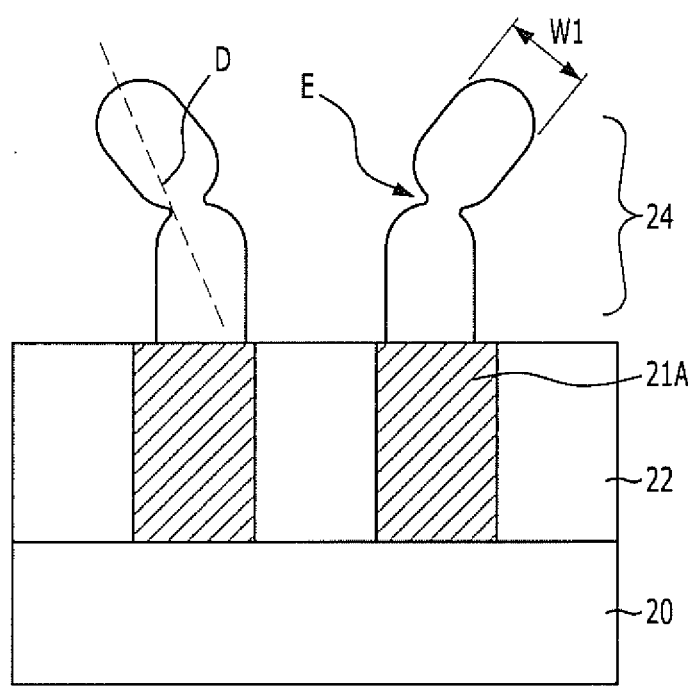
Figure 2D:
FIG. 2D shows a picture of a problem of the conventional semiconductor device fabrication process.

Other objects and advantages of this disclosure can be understood by the following description, and become apparent with reference to the embodiments of this disclosure.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like constituent elements, although they appear in different embodiments or drawings of this disclosure.

FIGS. 3A to 3D are cross-sectional views describing a method for fabricating gate patterns of a semiconductor device in accordance with a first embodiment of the present disclosure. Particularly, a method for forming a conductive layer based on silicon epitaxial growth technology will be described in the first embodiment.

Figure 3A:
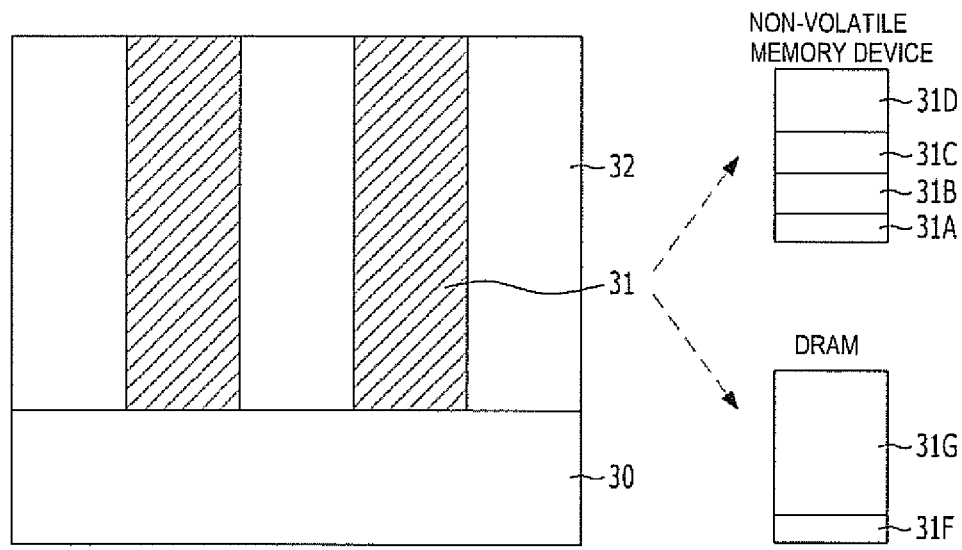
FIGS. 3A to 3D are cross-sectional views describing a method for fabricating gate patterns of a semiconductor device in accordance with a first embodiment of the present disclosure.

Referring to FIG. 3A, gate patterns 31 are formed over a substrate 30. The gate patterns 31 may be gate patterns of a DRAM device or gate patterns of a non-volatile memory device. For example, the gate patterns of a DRAM device include a gate insulation layer 31F and a gate electrode 31G. On the other hand, the gate patterns of a non-volatile memory device include a tunnel insulation layer 31A a charge trapping layer 31B, a charge blocking layer 31C, and a gate electrode 31D. In drawings, the gate pattern may be illustrated as a unit without necessarily illustrating individual layers thereof for the sake of convenience.

Also, the gate patterns 31, or the gate electrodes, include a conductive layer doped with an n-type impurity or a p-type impurity and an undoped conductive layer or a semiconductor material. For example, the gate electrode may include a polysilicon layer doped with an n-type impurity or a p-type impurity or germanium (Ge), and it may include other diverse semiconductor materials.

Subsequently, a first interlayer dielectric layer 32 is formed over the substrate with the gate patterns 31 formed therein. Herein, the first interlayer dielectric layer 32 may be formed of an oxide layer, such as dichlorosilane ($SiH_2Cl_2$) and nitrous oxide ($N_2O$), $SiH_4$ and $N_2O$, $SiH_2Cl_2$ and $O_2$, $SiH_4$ and $O_2$, $Si_2H_6$ and $O_2$, and tetraethyl orthosilicate (TEOS).

Subsequently, a planarization process is performed until the uppermost surface of each gate pattern 31 is exposed. The planarization process can minimize the step height of the first interlayer dielectric layer 32 during a subsequent etch-back process.

Figure 3B:
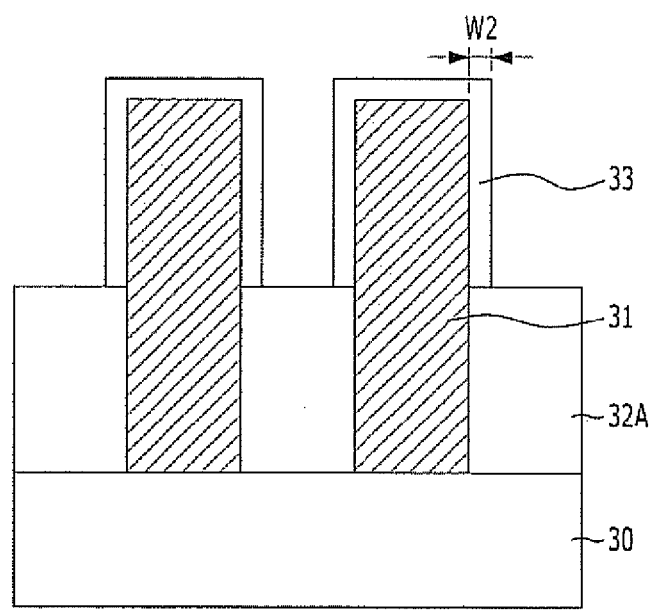

Referring to FIG. 3B, the upper portion of each gate pattern 31 is exposed by performing an etch-back process onto the first interlayer dielectric layer 32. The etch-back process is performed onto the first interlayer dielectric layer 32 to a predetermined depth below the uppermost surface of the gate patterns 31. Herein, the depth of the etch-back may be determined in consideration of the height and thickness of a metal silicide layer to be formed in a subsequent silicidation process.

Herein, the "upper portion" of each gate pattern 31 indicates "the portion from the uppermost surface of each gate pattern 31 to a spot lower than the uppermost surface by a predetermined depth." The etch-back process exposes the upper portion of each gate electrode. In the drawing, the first interlayer dielectric layer, which is etched back, is denoted with 32A.

Subsequently, conductive layer 33 covering top and sidewalls of each gate pattern 31, which is exposed through the etch-back process performed onto the first interlayer dielectric layer 32, are formed. In short, each conductive layer 33 is formed on the upper portion and the sidewalls of each gate pattern 31 to surround the upper portion of a gate electrode.

As described above, the formation of the conductive layer 33 covering top and each sidewalls of each gate pattern 31 may replenish the upper portion of each gate pattern 31 with silicon. Accordingly, a sufficient amount of a silicon source may be supplied during the subsequent silicidation process.

Also, the formation of the conductive layer 33 covering top and each sidewalls of each gate pattern 31, whose surface is damaged during the etch-back process of the first interlayer dielectric layer 32, may improve the layer quality of the surface of the gate pattern 31, which may lead to an improvement in the layer quality of an interface between a metal layer to be formed in a subsequent process and the gate patterns 31. Thus, the silicidation process is performed smoothly, and the layer quality of the silicide layer is improved.

Herein, the conductive layer 33 may include silicon, polysilicon, or amorphous silicon. Particularly, it is desirable that the polysilicon is of a small grain size. The conductive layer 33 may be doped with an n-type impurity or a p-type impurity, or not doped at all.

In addition, the thickness W2 of the conductive layer 33 may be determined in consideration of the width of silicified gate patterns to be formed in a subsequent silicidation process. For example, the thickness W2 of the conductive layer 33 may range from approximately 50 Å to approximately 150 Å.

The conductive layer 33 may be formed through silicon epitaxial growth technology. With the silicon epitaxial growth technology, the conductive layer 33 are formed selectively only to the upper portion of the exposed gate pattern 31. Therefore, a separate process for removing the conductive layer 33 formed on a region other than the surface of the upper portion of the gate patterns 31 (for example, an etch-back process) is not required.

When the silicon epitaxial growth technology is performed, the upper portion of the gate pattern 31, exposed by etching the first interlayer dielectric layer 32A, is cleaned, and then silicon is grown from the surface of the upper portion of each gate pattern 31. For example, the cleaning process may be performed at a temperature of approximately 700° C. to approximately 1000° C. using $H_2$ gas or hydrofluoride. Also, the silicon may be grown at a temperature of approximately 500° C. to approximately 800° C. under the pressure of approximately 0.1 Torr to approximately 10 Torr using $Si_2H_6$ gas or $SiH_4$ gas. Still, in another example, the silicon may be grown at a temperature of approximately 500° C. to approximately 800° C. under the pressure of approximately 1 Torr to approximately 100 Torr using a silane-based gas diluted with hydrogen ($H_2$) and hydrogen chloride (HCl).

Figure 3C:
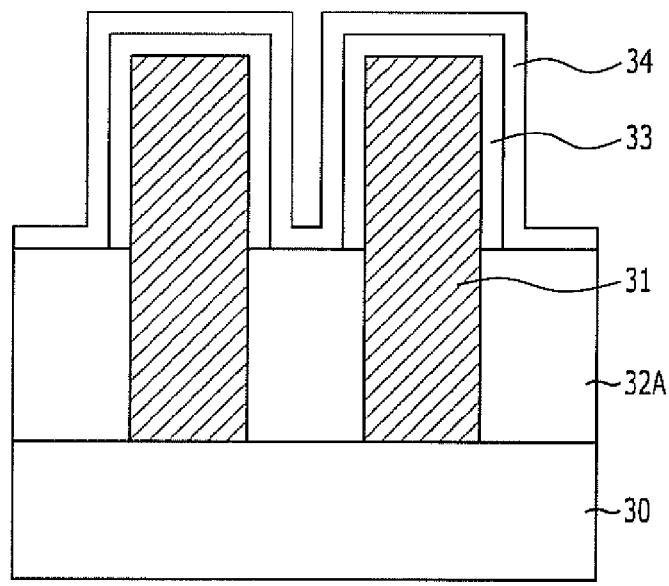

Referring to FIG. 3C, a metal layer 34 is formed over the conductive layer 33. The metal layer 34 may include cobalt (Co) or nickel (Ni). Although not illustrated in the drawing, a barrier metal may be formed over the metal layer 34.

The drawing illustrates the metal layer 34 deposited over the substrate with the conductive layer 33 formed therein. The metal layer 34 may be deposited through an Atomic Layer Deposition (ALD) method, a Chemical Vapor Deposition (CVD) method, a Physical Vapor Deposition (PVD) method, or a sputtering method. Alternatively, other typical deposition methods may be used. When the sputtering method is used, it is possible to form the metal layer 34 selectively over the conductive layer 33 by taking advantage of the linearity of the sputtering process.

Figure 3D:
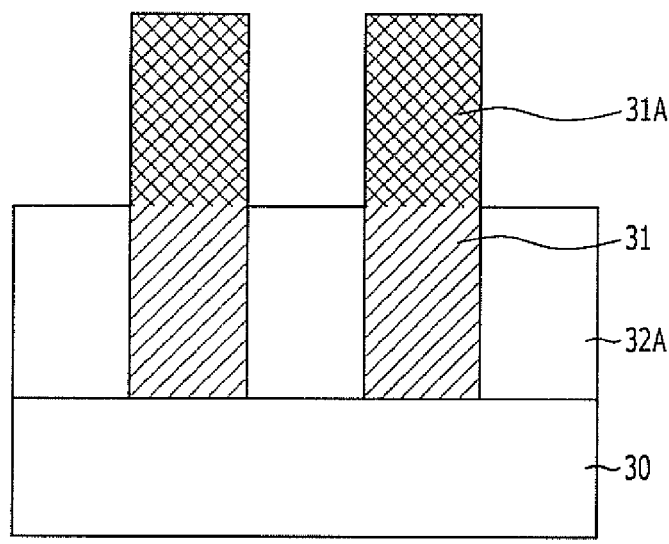

Referring to FIG. 3D, a thermal treatment is performed to have the metal layer 34 react with the upper portion of each gate pattern 31 and thereby silicify the upper portion of each gate pattern 31. When the gate patterns 31 include Ge, as described before, the gate patterns 31 may be germanized. Herein, the metal-silicified upper portion of the gate pattern is denoted with 31A.

Subsequently, the metal layer 34 remaining unreacted in the thermal treatment is removed. The unreacted metal layer 34 may be removed using a mixture of $NH_4OH$, $H_2O_2$, and deionized water (DI).

According to the embodiment described above, the conductive layer 33 covering the upper portion of each gate pattern 31 may sufficiently compensate the upper portion of each gate pattern 31 for the damage caused during the etch-back process of the first interlayer dielectric layer 32. In other words, the conductive layer 33 may compensate for the loss of silicon and sufficiently provide a silicon source to be used in the subsequent silicidation process. Therefore, the method of the present embodiment may widen the width of the metal-silicified upper portion 31A of the gate pattern in comparison to that of a conventional method, and, accordingly, it is possible to prevent the gate pattern 31 from inclining or being broken.

Also, when the conductive layer 33 includes silicon of a small grain size or amorphous silicon, a high-quality silicide layer (i.e., a silicide layer with a small resistance value), may be formed. This decreases the resistance of a gate electrode or the resistance of a word line and thus makes it possible to secure an operation rate required by a semiconductor device.

In particular, it is possible to easily form the conductive layer 33 on the upper portion of each gate pattern 31 by using silicon epitaxial growth technology. Since the conductive layer 33 is not formed over the first interlayer dielectric layer 32 exposed between adjacent gate patterns 31, an additional process of removing the conductive layer 33 does not have to be performed. In short, when the silicon epitaxial growth technology is used, the conductive layer 33 may be formed easily.

Figure 4A:
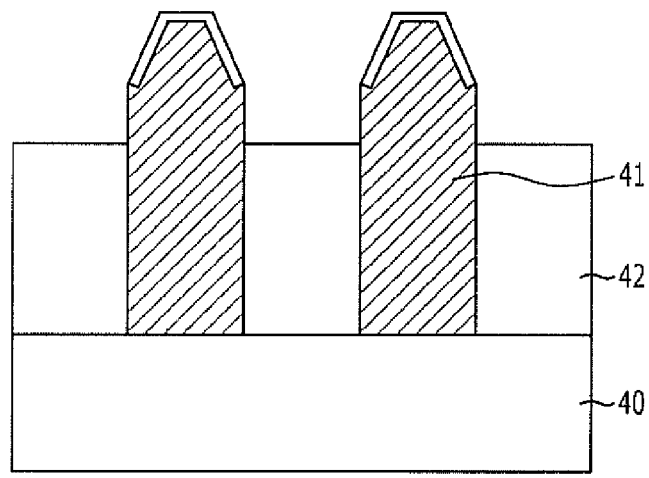
FIGS. 4A to 4C are cross-sectional views describing a method for fabricating gate patterns of a semiconductor device in accordance with a second embodiment of the present disclosure.
Figure 4B:
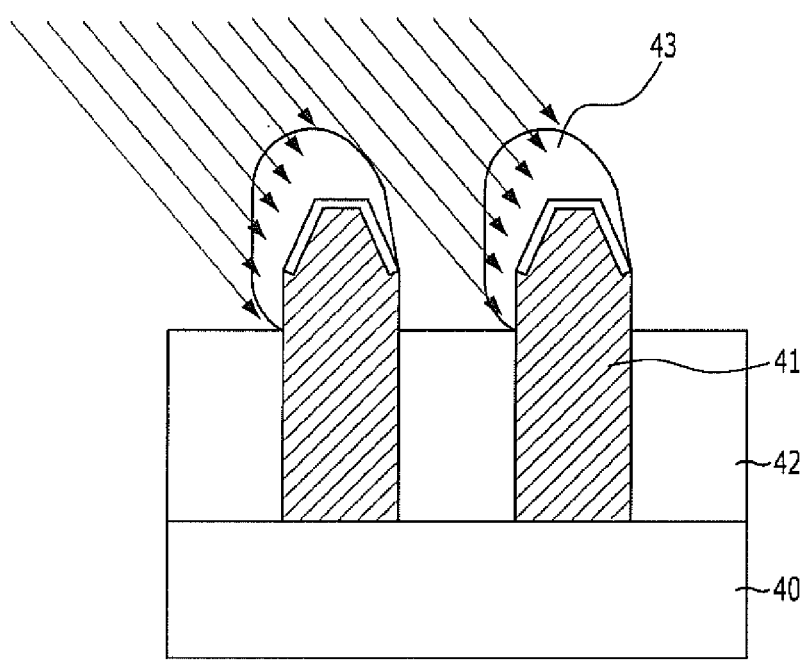
Figure 4C:
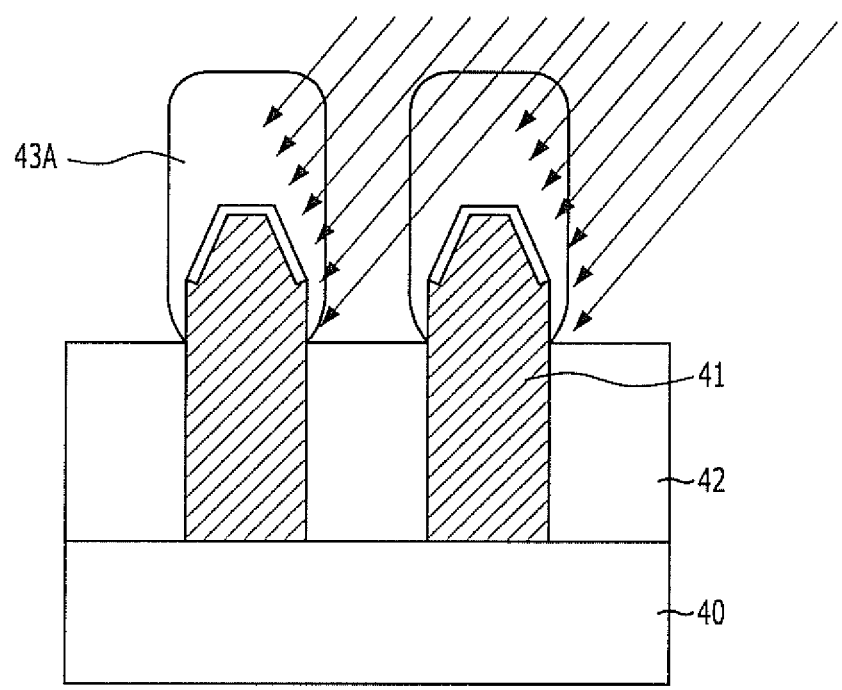

FIGS. 4A to 4C are cross-sectional views describing a method for fabricating gate patterns of a semiconductor device in accordance with a second embodiment. The method according to the second embodiment is appropriate for compensating for a damaged gate pattern. Herein, a case of using a sputtering method will be described.

Referring to FIG. 4A, a gate pattern 41 is formed over a substrate 40, and an interlayer dielectric layer 42 formed over the substrate 40 is etched back to expose the upper portion of each gate pattern 41. As described before, the upper portion of each gate pattern 41 may be damaged or an impurity layer may be formed during the etch-back process performed onto the interlayer dielectric layer 42.

Referring to FIGS. 4B and 4C, conductive layer 43A are formed through a sputtering method. Herein, the linearity of the sputtering method (see arrows in the drawing) may be used. The conductive layer 43A may be formed by repeatedly performing the sputtering process onto the substrate 40 at a predetermined angle. In other words, the conductive layer 43A may be formed by sequentially depositing a material layer for conductive layer 43A on each side of the upper portion of the gate pattern 41.

As shown in FIG. 4B, a part 43 of the conductive layer is formed on one side of each gate pattern 41 by a sputtering process. Subsequently, as illustrated in FIG. 4C, another part of the conductive layer is formed on another side of the gate pattern 41 by performing another sputtering process to thereby form a conductive layer 43A covering the upper portion of the gate pattern 41.

When the conductive layer 43A are formed using the sputtering process, the material layer for conductive layer 43A may be easily deposited on the uppermost surface and sidewalls of the conductive layer 43A. Characteristically, the deposition amount increases as it goes toward the uppermost portion of the gate pattern 41 in the sputtering process. Therefore, lost silicon may be replenished by sufficiently depositing the material layer for conductive layer on the uppermost portion of each gate pattern 41. In other words, the conductive layer 43A make the gate patterns 41 have a uniform width on the whole by compensating for the narrower width of the upper portion of each gate pattern 41.

Also, during the sputtering process, adjacent gate patterns 41 serve as barrier layers for each other. Thus, the material layer for conductive layer 43A is not deposited on the interlayer dielectric layer 42 exposed between the adjacent gate patterns 41, but is deposited only on the surface of the upper portions of the gate patterns 41. Therefore, it is not necessary to perform a separate removal process. Of course, where there is no gate pattern 41 to serve as a barrier layer, the material layer for conductive layer 43A may be deposited on the interlayer dielectric layer 42. In this case, however, it is possible to prevent the material layer for conductive layer 43A from being deposited on the interlayer dielectric layer 42 by forming a dummy pattern.

Also, since a plurality of conductive layer 43A are formed in a uniform shape, a process for shaping the conductive layer 43A uniformly, such as a planarization process, does not have to be performed. In short, when the sputtering process is performed, the conductive layer 43A may be easily formed by a simple deposition process.

FIGS. 5A to 5D are cross-sectional views describing a method for fabricating gate patterns of a semiconductor device in accordance with a third embodiment. Particularly, a method of forming conductive layer in a uniform shape will be described in the third embodiment.

Figure 5A:
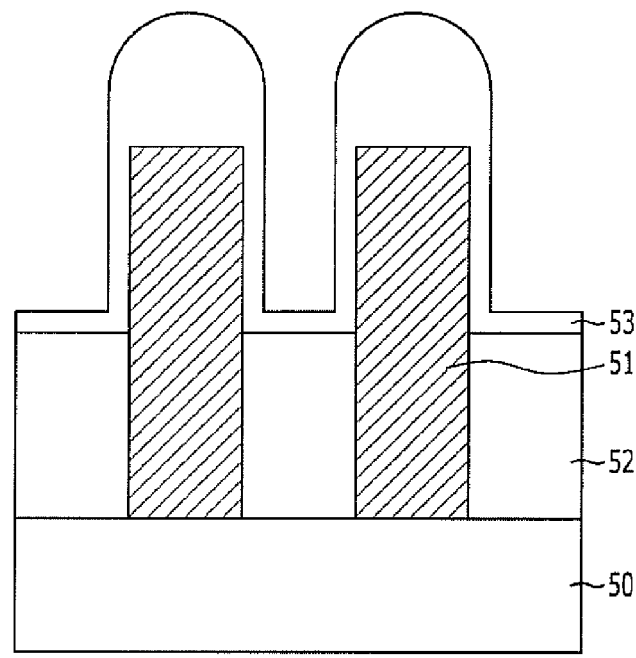
FIGS. 5A to 5D are cross-sectional views describing a method for fabricating gate patterns of a semiconductor device in accordance with a third embodiment of the present disclosure.

Referring to FIG. 5A, gate patterns 51 are formed over a substrate 50 and a first interlayer dielectric layer 52 formed over the gate patterns 51 is etched back to expose the upper portion of each gate pattern 51.

Subsequently, a material layer 53 for conductive layer is formed over the substrate with the gate patterns 51 having an exposed upper portion. The material layer 53 for conductive layer may be formed through a deposition method, such as an Atomic Layer Deposition (ALD) method, a Chemical Vapor Deposition (CVD) method, a Physical Vapor Deposition (PVD) method, or a sputtering method.

For example, when the material layer 53 for conductive layer is deposited through a sputtering process, the material layer 53 for conductive layer may be formed over the substrate by taking advantage of the linearity of the sputtering process and performing the sputtering in a direction perpendicular to the substrate 50. When the material layer 53 for conductive layer is formed based on the linearity of the sputtering process, the material layer 53 for conductive layer may be deposited more in the upper portion of each gate pattern 51 than in the lower portion. Thus, the damage on the upper portion of each gate pattern 51 may be compensated for efficiently.

Figure 5B:
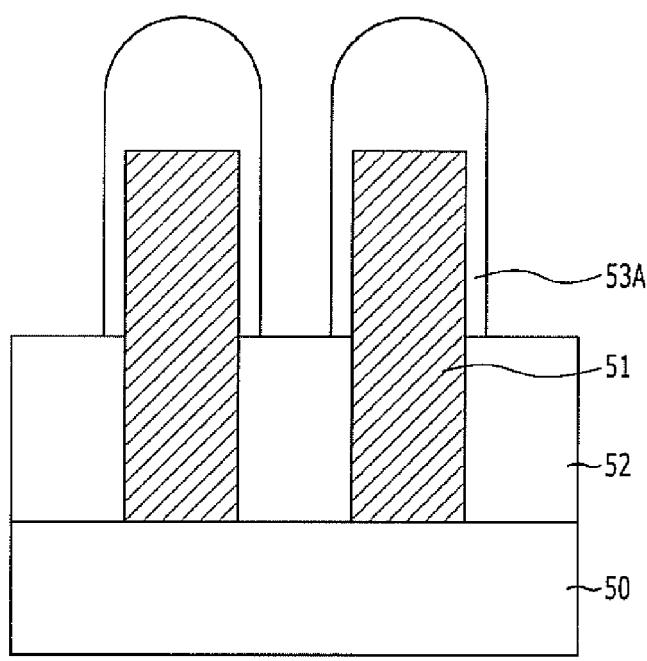

Referring to FIG. 5B, the material layer 53 for conductive layer is etched back until the surface of the first interlayer dielectric layer 52 between gate patterns 51 is exposed, so as to isolate adjacent gate patterns 51 from one another. As a result of this process, conductive layer 53A covering the upper portion of each gate pattern 51 are formed.

Herein, the material layer 53 for conductive layer is deposited thicker as it reaches the uppermost portion of each gate pattern 51. In other words, the uppermost surface of each conductive layer 53A may have a swollen shape, as shown in FIG. 5B. Also, when the upper portion of each gate pattern 51 is damaged, and thereby comes to have a sharp shape, the conductive layer 53A formed along the profile of the gate patterns 51 may have a sharp shape as well.

In this case, since the uppermost surface of the material layer 53 for a conductive layer is not flat, a metal layer may be formed disproportionally in a subsequent process for forming the metal layer. Therefore, it is desirable to further perform a planarization process to planarize the uppermost surface of each conductive layer 53A.

Figure 5C:
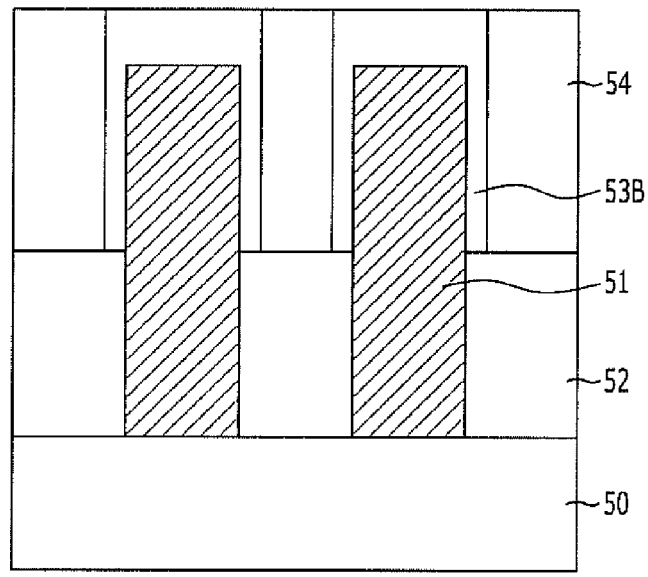

Referring to FIG. 5C, a second interlayer dielectric layer 54 is formed over the resultant substrate with the conductive layer 53A formed therein, and a planarization process is performed until the surface of each conductive layer 53A is exposed and wider than its respective gate pattern 51. In the drawing, the conductive layer having a flat uppermost surface after the planarization process are denoted with a reference numeral 53B.

Herein, the second interlayer dielectric layer 54 may be formed of a material which is different from that of the first interlayer dielectric layer 52. In particular, it is desirable to form the second interlayer dielectric layer 54 of a material having a high etch selectivity with respect to the first interlayer dielectric layer 52.

The planarization process not only makes the shape of a plurality of conductive layer 53B uniform, but also planarizes the uppermost surfaces of the conductive layer 53B to thereby uniformly form a metal layer in a subsequent process of forming the metal layer.

Figure 5D:
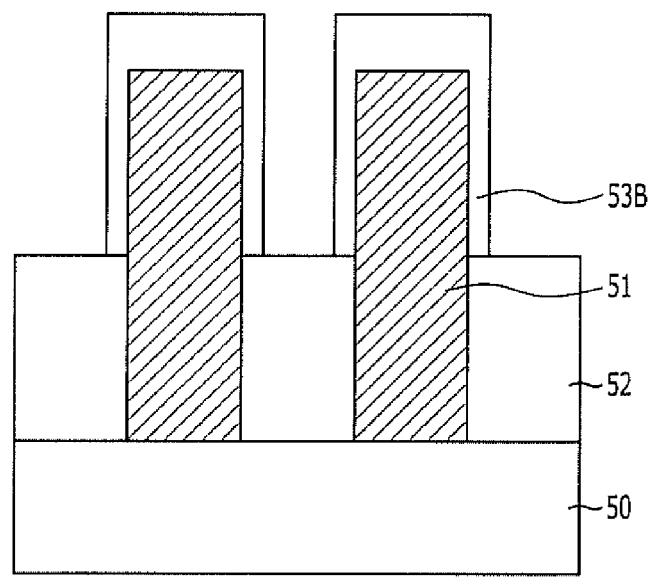

Referring to FIG. 5D, the second interlayer dielectric layer 54 is removed. Subsequently, although not illustrated in the drawing, a silicidation process is performed onto the conductive layer 53B and the upper portion of each gate pattern 51.

FIGS. 6A to 6D are cross-sectional views describing a method for fabricating gate patterns of a semiconductor device in accordance with a fourth embodiment. Particularly, a method of forming conductive layers on the uppermost surface of the gate patterns will be described in the fourth embodiment.

Figure 6A:
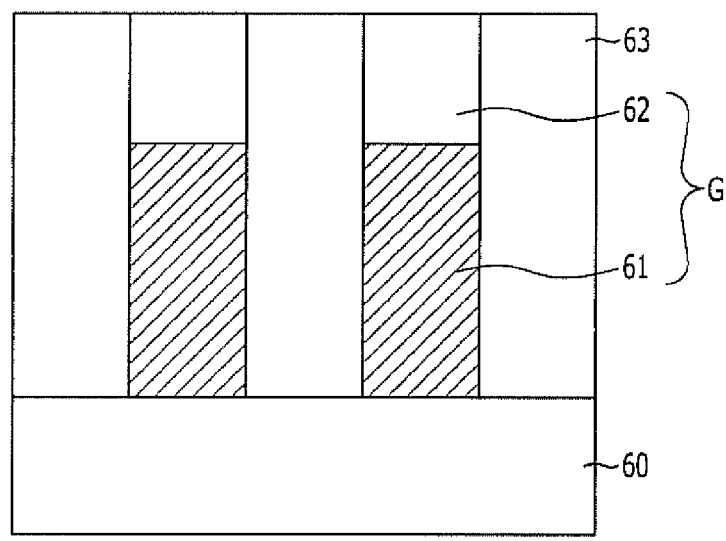
FIGS. 6A to 6D are cross-sectional views describing a method for fabricating gate patterns of a semiconductor device in accordance with a fourth embodiment of the present disclosure.

Referring to FIG. 6A, a first conductive layer 61 and a first hard mask layer 62 are sequentially formed over a substrate. Then, the first hard mask layer 62 and the first conductive layer 61 are etched to form a plurality of gate patterns G. Herein, the first hard mask layer 62 may be formed by stacking one or more heterogeneous hard masks, and it may further include a nitride layer.

The gate patterns G may be gate patterns of a DRAM device or gate patterns of a non-volatile memory device. For convenience, the drawing illustrates only a gate electrode included in each gate pattern.

According to this embodiment, a second conductive layer is additionally formed over the first conductive layer 61. The height of the first conductive layer 61 may be determined in consideration of the height of the second conductive layer formed in a subsequent process.

Subsequently, an insulation layer 63 is formed to fill a gap region between a plurality of gate patterns G. The insulation layer 63 may be formed of a material having a high etch selectivity with respect to the first hard mask layer 62. The insulation layer 63 may include an oxide layer.

Figure 6B:
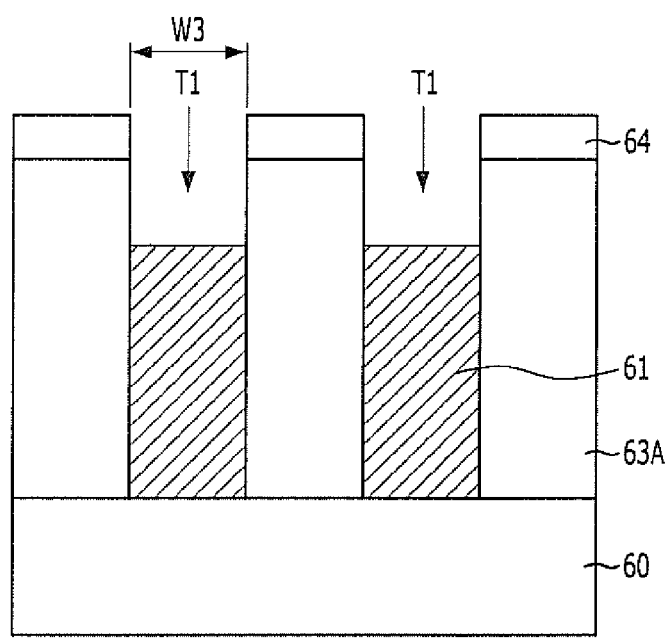

Referring to FIG. 6B, trenches T1 are formed by removing the first hard mask layer 62. Herein, the trenches T1 are spaces for forming conductive layer in a subsequent process and they have the same width W3 as that of the first conductive layer 61 in the lower portion.

According to an embodiment, the first hard mask layer 62 may be removed using the insulation layer as an etch barrier. As described above, since the insulation layer 63 is formed of a material having a high etch selectivity with respect to the first hard mask layer 62, it is possible to selectively remove the first hard mask layer 62 using the insulation layer as an etch barrier.

According to another embodiment, the first hard mask layer 62 may be removed using a second hard mask layer 64 formed over the insulation layer 63 as an etch barrier. In short, after the second hard mask layer 64 is formed to expose the first hard mask layer 62, while covering the insulation layer 63, the first hard mask layer 62 may be removed using the second hard mask layer 64 as an etch barrier.

According to yet another embodiment, the first hard mask layer 62 may be removed using the second hard mask layer 64 filling a recess region of a predetermined depth from the surface of the insulation layer 63 as an etch barrier. In other words, after the insulation layer 63 is recessed to a predetermined depth from the surface, the recessed region is filled with the second hard mask layer 64. The second hard mask layer 64 is then used as an etch barrier, so that only the first hard mask layer 62 is selectively removed. The drawings illustrate a case where the insulation layer 63 is recessed to form the second hard mask layer 64. The recessed insulation layer of a predetermined depth is denoted with a reference numeral 63A.

As described, when the first hard mask layer 62 is removed using the second hard mask layer 64, the second hard mask layer 64 may be formed of a material which is different from a material forming the first hard mask layer 62. Particularly, the second hard mask layer 64 may be formed of a material which has a large etch selectivity with respect to the first hard mask layer 62 and the insulation layer 63.

Figure 6C:
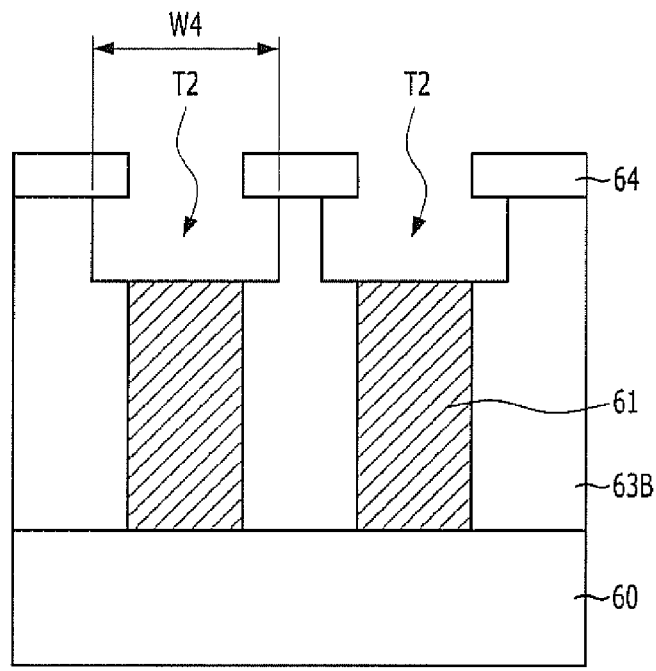

Referring to FIG. 6C, to increase the width W3 of the trenches T1, portions of the insulation layer 63A forming the internal walls of the trenches T1 are etched by a predetermined thickness. In the drawing, the insulation layer etched by the predetermined thickness is denoted with reference numeral 63B, and the trenches T1 with an increased width W4 are denoted with reference numeral T2.

According to an embodiment, when the trenches T1 are formed using the insulation layer 63B as an etch barrier, the trenches T2 with a wide width W4 may be formed by isotropically etching the insulation layer 63B.

According to another embodiment, when the trenches T1 are formed using the second hard mask layer 64 as an etch barrier, the insulation layer 63A exposed through the inner walls of the trenches T1 is etched by a predetermined thickness by using the second hard mask layer 64 as an etch barrier. Herein, the etching of the insulation layer 63A may be performed by the isotropic etch process. Particularly, the insulation layer 63A may be etched through a wet etch process.

Figure 6D:
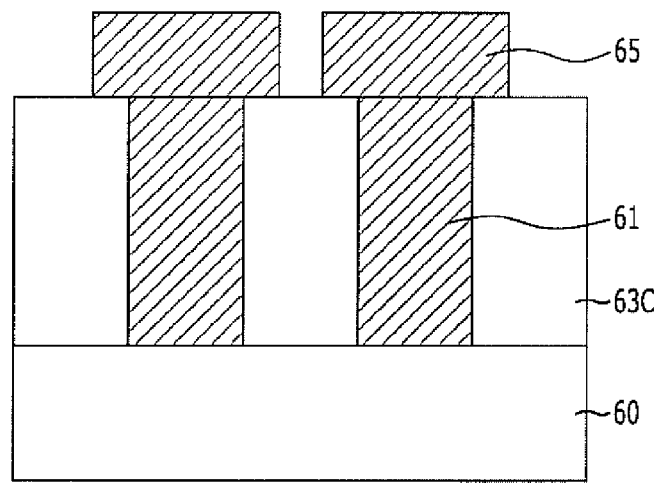

Referring to FIG. 6D, the trenches T2 with the increased width W4 are filled with a second conductive layer 65.

Herein, when the preceding processes are performed using the second hard mask layer 64, it is desirable to remove the second hard mask layer 64 first and then fill the trenches T2 with the second conductive layer 65.

Herein, the second conductive layer 65 serves as conductive layer described in accordance with the first to third embodiments. The second conductive layer 65 is used as a silicon source for supplying a sufficient amount of silicon in a subsequent silicidation process. Therefore, the second conductive layer 65 may be formed of silicon, polysilicon, or amorphous silicon, and it is desirable to use polysilicon with a small grain size.

Subsequently, the insulation layer 63B is etched back to expose sidewalls of the second conductive layer 65. In the drawing, the etched insulation layer is denoted with reference numeral 63C. Since the second conductive layer 65 has a wider width than that of the first conductive layer 61, although some of the second conductive layer 65 is damaged during the etch-back process, it is possible to supply a sufficient amount of silicon needed for the subsequent silicidation process.

Subsequently, although not illustrated in the drawing, a silicidation process is performed onto the second conductive layer 65.

According to the embodiments of this disclosure described above, since the second conductive layer 65 is additionally formed on the gate patterns G, it is possible to supply a sufficient amount of silicon in the silicidation process.

In particular, since the second conductive layer 65 is formed to have a wide width W4 compared to the gate patterns G, the damage resulting from the etch-back of the insulation layer 63B may be minimized. Also, since the trenches T2 are filled with the second conductive layer 65, the second conductive layer 65 of a uniform shape may be formed.

Figure 7A:
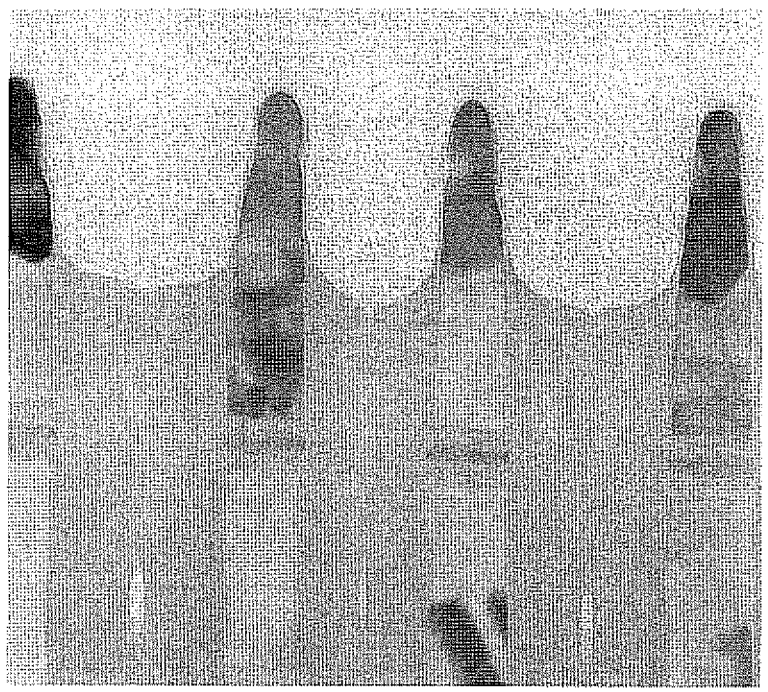
FIGS. 7A to 7C show a picture and graphs describing the effects of exemplary embodiments of the present disclosure.

FIG. 7A shows a picture of silicified gate patterns formed in accordance with an embodiment. According to the present invention, a sufficient amount of silicon may be supplied in a silicidation process by forming conductive layer covering the upper portion of each gate pattern. Therefore, it is possible to prevent the width of each silicified gate pattern from decreasing and thereby prevent the gate patterns from being inclined or collapsed.

Figure 7B:
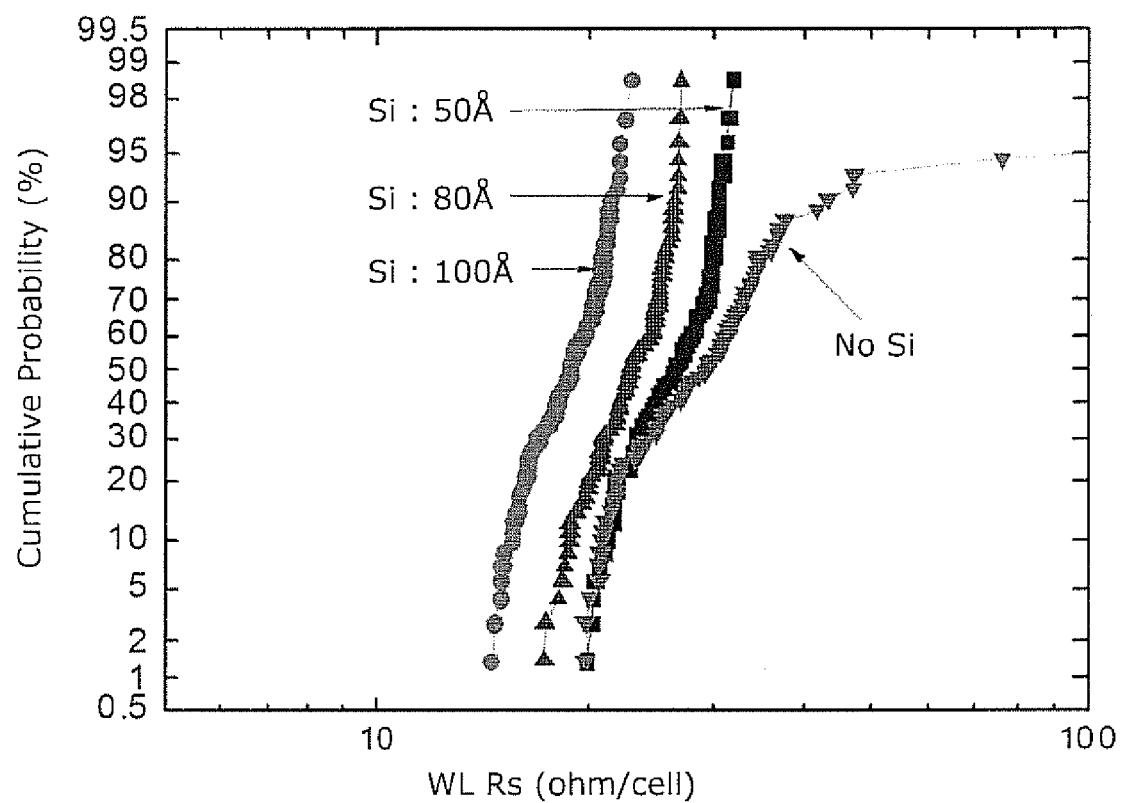

FIG. 7B shows a graph indicating a surface resistance Rs of a word line WL when the conductive layer are formed. The X axis denotes the surface resistance Rs of a word line WL, while the Y axis denotes a cumulative probability. It can be seen from the graph that the additional silicon, resulting from the formation of conductive layer covering the upper portion of each gate pattern, decreases the resistance value of the word line.

Figure 7C:
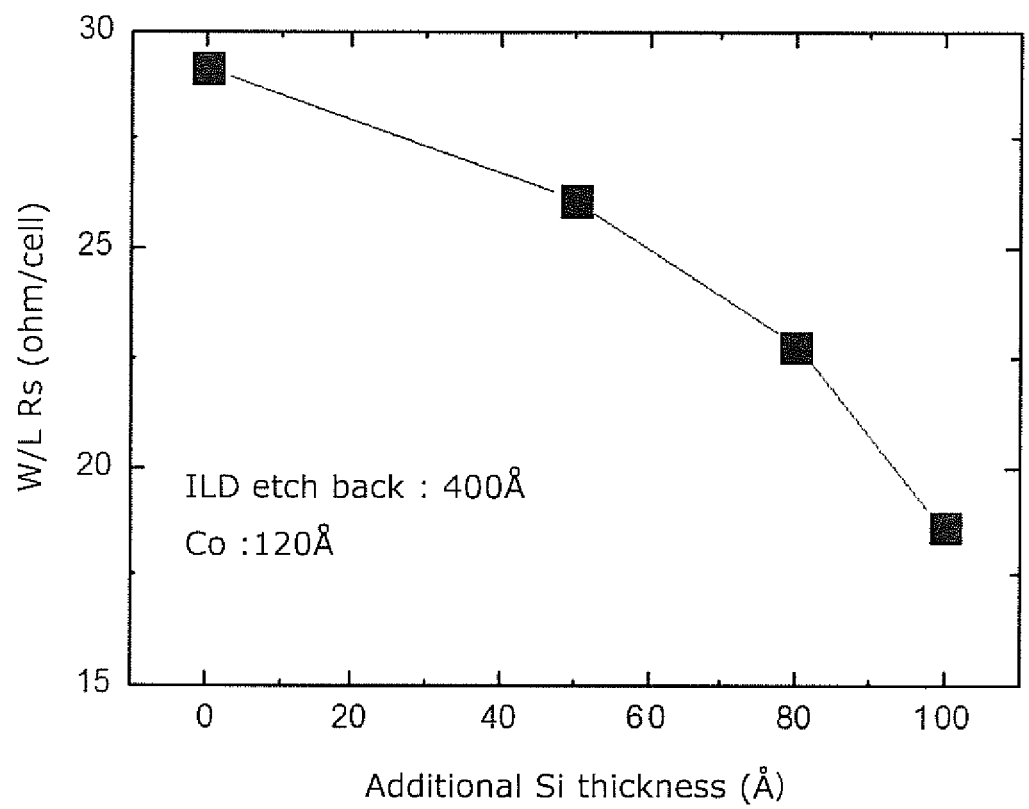

FIG. 7C is a graph showing a surface resistance Rs of a word line W/L according to the thickness of a conductive layer. The X axis denotes the thickness of a conductive layer, while the Y axis denotes a surface resistance Rs value of the word line W/L. It can be seen from the graph that the resistance value of a word line decreases as the conductive layer become thick.

According to the method of the present disclosure, conductive layer are additionally formed after the formation of gate patterns. Therefore, although the width of each gate pattern is decreased due to an improved integration degree of a semiconductor device, it is possible to reduce the resistance of a gate electrode and a word line by forming the conductive layer, which leads to an increase in the width.

Also, although the width of each gate pattern is decreased as the upper portion of each gate pattern is damaged during an etch-back process of an interlayer dielectric layer for exposing the upper portion of the gate pattern, the damage may be compensated for by forming the conductive layer. The conductive layer make it possible to provide a sufficient amount of a silicon source for a silicidation process, and prevent a silicified gate pattern from inclining or being broken.

Particularly, whether an impurity layer is formed or the upper portion of each gate pattern is damaged during the etch-back process of the interlayer dielectric layer, it is possible to perform the silicidation process by additionally forming and curing the conductive layer. Moreover, it is possible to form a silicide layer having an even smaller resistance value by forming conductive layer including amorphous silicon or silicon with a small grain size.

Consequently, the characteristics of the semiconductor device may be improved by reducing the resistances of a gate electrode or a word line, and increasing the read/write operation rate of a DRAM device or the program/erase operation rate of a non-volatile memory device, compared to the conventional characteristics.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming gate patterns over a substrate;
    forming first interlayer dielectric patterns having a top surface lower than the gate patterns between the gate patterns, wherein each of the gate patterns include an upper gate pattern protruded from the first interlayer dielectric pattern and a lower gate pattern buried in the first interlayer dielectric pattern;
    forming a conductive layer covering a top surface and sidewalls of each upper gate pattern, wherein the conductive layer includes silicon with a small grain size;
    forming a metal layer for a silicidation process over the conductive layer; and
    fully silicifying the metal layer, the conductive layer and the upper gate patterns to form a metal-silicified layer over the lower gate pattern,
    wherein the conductive layer replenishes silicon to the sidewalls of each upper gate pattern for the silicifying of the metal layer, the conductive layer and the gate patterns, so that a width of metal-silicified layer is substantially identical to a width of the gate pattern,
    wherein the upper gate pattern becomes the metal-silicified layer through the fully silicifying, so that the upper gate pattern is formed of only the metal-silicified layer.

2. The method of claim 1, wherein the forming of the first interlayer dielectric patterns includes:
    forming a first interlayer dielectric layer over the substrate after forming the gate patterns; and
    performing an etch-back process on the first interlayer dielectric layer to a predetermined depth below the top surface of the gate patterns.

3. The method of claim 2, wherein the conductive layer improves a surface layer quality of the gate patterns.

4. The method of claim 2, wherein the metal-silicified layer has the same width as each of the gate patterns.

5. The method of claim 1, wherein each gate pattern includes a gate insulation layer and a gate electrode formed over the substrate.

6. The method of claim 1, wherein each gate pattern includes a tunnel insulation layer, a charge trapping layer, a charge blocking layer, and a gate electrode formed over the substrate.

7. The method of claim 1, wherein the conductive layer includes silicon, polysilicon, or amorphous silicon.

8. The method of claim 1, wherein the forming of the conductive layer is performed by a silicon epitaxial growth method.

9. The method of claim 1, wherein the conductive layer is formed between the metal layer and the gate patterns.

10. The method of claim 1, wherein the conductive layer includes the same material as the gate patterns.

11. The method of claim 1, further comprising:
    forming an interlayer dielectric layer to cover the substrate between the gate patterns, wherein the conductive layer has a gap between the gate patterns and contacts the interlayer dielectric layer, and the conductive layer does not cross the entire length of a top surface of the interlayer dielectric layer between the gate patterns.

12. The method of claim 11, wherein the metal layer extends across the entire length of the top surface of the interlayer dielectric layer between the gate patterns.

* * * * *